Sept. 12, 1961

B. BIRKENES 2,999,927

RADIO RECEIVER CIRCUIT

Filed Nov. 3, 1958

INVENTOR.
Bernhard Birkenes
BY Mueller & Aichele
Attys.

United States Patent Office 2,999,927

Patented Sept. 12, 1961

2,999,927

RADIO RECEIVER CIRCUIT

Bernhard Birkenes, Chicago, Ill., assignor to Motorola, Inc., Chicago, Ill., a corporation of Illinois Filed Nov. 3, 1958, Ser. No. 771,538
3 Claims. (Cl. 250—20)

Figures 1, 2:
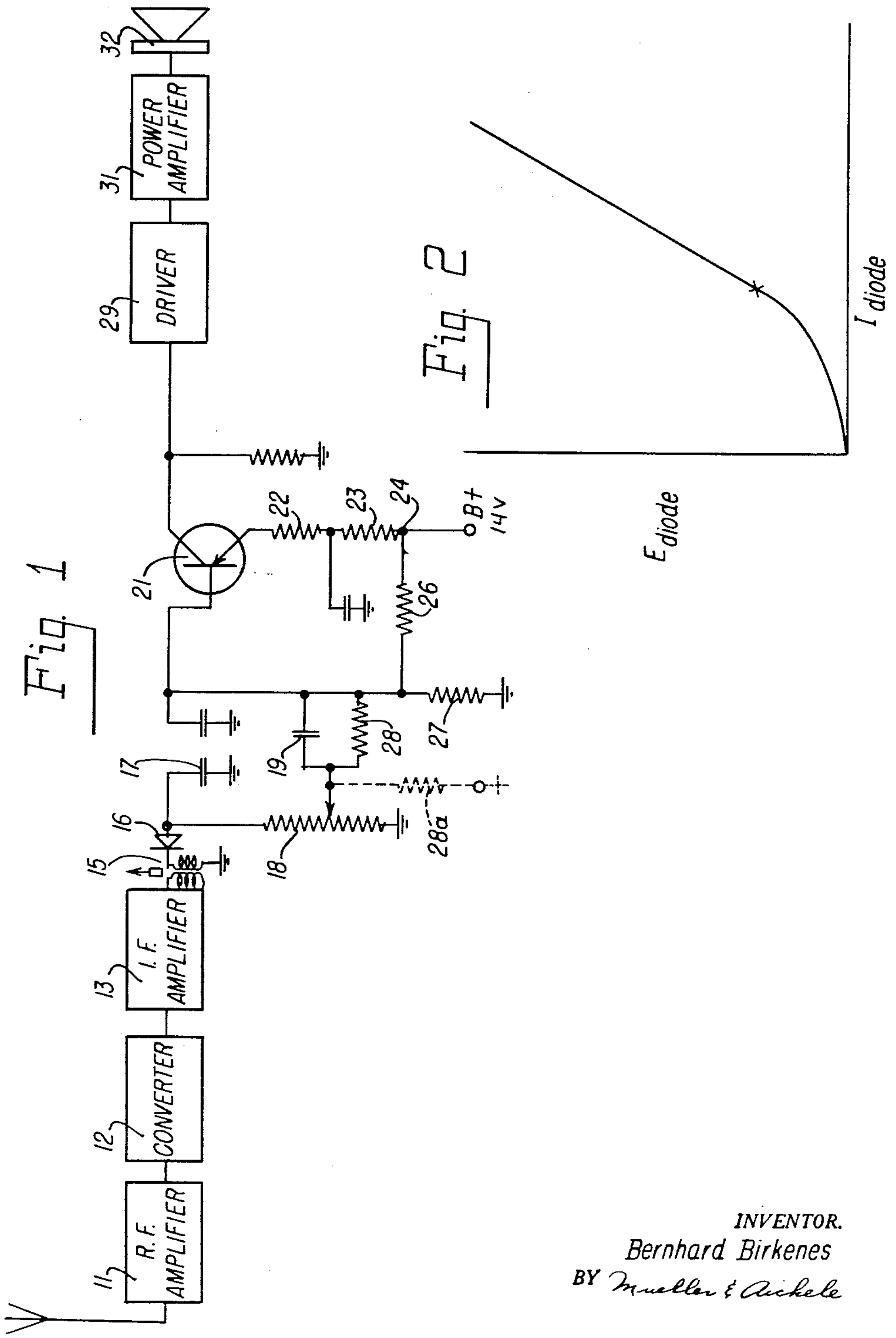

This invention relates to auto radio receivers and more particularly to means for stabilizing the audio output of auto radio receivers having transistor stages.

Auto radio receivers are normally energized from the automobile electrical system which includes a battery, a generator, and a voltage regulator of some type which holds the voltage of the system within fixed limits. In many automobiles a mechanical voltage regulator is employed which cuts in and out rather suddenly so that momentary sudden changes in available supply voltage take place. A sudden drop in voltage of the system may thus cause the radio receiver energized therefrom to fade out temporarily.

A recent development in auto radio receiver design has been the partial or total replacement of vacuum tubes by transistors. In transistorized stages of receivers it is generally necessary to employ coupling capacitors of substantially greater capacitance than those used in vacuum tube receivers because of the generally lower impedance of the transistorized stage. For example, a five microfarad electrolytic capacitor may be employed to couple the detector diode to the transistor audio frequency amplifier stage of a receiver. One side of this capacitor may be connected to the supply voltage through the transistor bias circuit and the potential of this point may be subject to sudden changes due to the action of a mechanical voltage regulator of the automobile. When such a sudden change of potential takes place, the coupling capacitor cannot change its charge instantaneously so that a potential difference may be developed to cause current to flow tending to bias the detector diode toward its nonconducting state thus causing a fadeout of the signal during the period in which the capacitor is changing charge. This problem arises in a transistorized stage of a radio receiver because the coupling capacitor is connected to the base of the transistor which must in turn be coupled to the power source to obtain bias voltage. Thus the detector diode can be affected by changes in supply voltage.

It is an object of the present invention, therefore, to provide an auto radio receiver whose audio output is stabilized against sudden changes in supply voltage.

It is a further object of the invention to provide simple and effective means for protecting a detector diode in a radio receiver connected to a variable voltage power source against the adverse effects of sudden voltage changes.

It is another object of the invention to provide a radio receiver particularly adapted for use in a vehicle having a transistor stage stabilized against signal fadeout of the type caused by sudden voltage drop from a power source.

A feature of the present invention is the provision of means for biasing the detector diode of an auto radio receiver having a transistor audio stage so that the relative polarities of the sides of the diode will not be changed by sudden variation in supply voltage for the receiver.

A further feature of the invention is the provision of a high ohmic value resistor in parallel with the coupling capacitor connected to a detector diode to bias one side of the diode so that it will remain conductive despite changes in input voltages that occurs too rapidly to be compensated for by a change of charge of the capacitor.

In the accompanying drawings:

FIG. 1 is a diagram showing an auto radio receiver in accordance with the present invention partly in block diagram form and partly in schematic form; and FIG. 2 is a graph of diode voltage plotted against diode current showing the operating point of a detector diode in accordance with the present invention.

The auto radio receiver in accordance with the present invention includes a coupling capacitor between a detector diode and a transistor audio frequency amplifier stage. The capacitor is connected to the diode through a volume control potentiometer. The other side of the capacitor is connected to the transistor bias circuit which is in turn connected to a supply voltage source the potential of which is subject to sudden variation. A sudden drop in the potential of the supply source would tend to set up a potential difference between the one side of the capacitor and the potentiometer which would cause current to flow tending to bias the diode toward a nonconducting condition. This would result in a decrease in the amplitude of the signal passed by the diode and cause the volume of the audio signal to fade. This occurs because a discrete time is required for the capacitor to change charge to compensate for the change in supply potential as it is part of a resistance-capacitance network of relatively long time constant. In accordance with the invention, this effect is avoided by effectively biasing the diode toward conductivity. Thus, a sudden change in the supply voltage cannot result in a shift in the operating point of the diode to an extent that would cause signal fade-out.

The auto radio receiver illustrated in FIG. 1 includes a radio frequency amplifier stage 11, converter stage 12, and one or more intermediate frequency amplifier stages 13. These stages are shown in block diagram form since they may be of conventional circuit design. These stages may include vacuum tubes or may be transistorized. In the embodiment illustrated, a detector diode 16 has its more positive side connected to the output transformer 15 of the intermediate frequency amplifier stage 13. The more negative side of the diode is bypassed for RF through the capacitor 17 and also connected to the volume control potentiometer 18 which forms the detector load and is in a D.C. path with the secondary of transformer 15.

Electrolytic capacitor 19 connected to potentiometer 18 couples the detector diode to an audio frequency amplifier stage which includes the transistor 21 having its emitter connected to a B+ power source through bias resistors 22 and 23. In a vehicle electrical system, the B+ voltage is supplied from a generator-battery combination so that it will be understood that the potential of the point indicated by reference character 24 may be subject to sudden changes of a momentary character such as those caused by the cutting in or cutting out of a mechanical voltage regulator. Resistors 26 and 27 serve as a voltage divider for providing a bias potential to the base of transistor 21. A resistor 28 of relatively high ohmic value is connected in parallel with the capacitor 19. Since both potentiometer 18 and resistor 27 are grounded, resistor 28 is connected in a direct current circuit.

The collector of transistor 21 is coupled to a driver stage 29 which in turn is connected to power amplifier stage 31 which controls the speaker 32. The driver and amplifier stages are also of conventional circuit design and may be transistorized.

When a sudden drop in the B+ supply voltage takes place the potential of the point 24 will likewise drop. In the absence of the resistor 28, this could cause a current to flow in potentiometer 18 during the period in which capacitor 19 is changing its charge in order to accommodate such change. Because the resistance values of resistor 26 and potentiometer 18 are necessarily substantial, they form a resistance-capacitance network of relatively long time constant in conjunction with capacitor 19. The current flowing in potentiometer 18 would be in such a sense as to apply negative voltage to the diode 16 tending to bias it toward its nonconducting state and thus decrease its sensitivity as a detector. The presence of the large ohmic value resistor 28, however, effectively biases the diode into conduction by applying a positive voltage from the junction of resistors 26 and 27 to the potentiometer 18 and clamps the connection point to potentiometer 18 at a value that will be slightly positive with respect to ground so that when a sudden change of potential of point 24 does take place the bias on the diode 16 is not shifted sufficiently to affect its sensitivity.

The effect of resistor 28 is to establish the operating point of the diode 19 effectively at the point indicated by X in FIG. 2. The establishment of this operating point on the linear part of the diode curve renders its response linear throughout the entire range in which it is used in the circuit and thus improves its sensitivity.

In a typical embodiment of the present invention wherein an auto radio receiver is operated by a vehicular electrical system to supply a voltage having an average value of 13.2 volts at the point 24 various significant components of the circuit had the following values:

| | |
|---|---|
| Potentiometer 18 | 10,000 ohms maximum resistance. |
| Capacitor 19 | 5 microfarads. |
| Resistor 22 | 270 ohms. |
| Resistor 23 | 1,000 ohms. |
| Resistor 26 | 10,000 ohms. |
| Resistor 27 | 82,000 ohms. |
| Resistor 28 | 390,000 ohms. |

The bias potential applied to the diode could obviously be obtained from other potential sources in the receiver, e.g. by coupling resistor 28 between potentiometer 18 and some other positive voltage source. This is shown as resistor 28a in FIG. 1. The essential point is to apply to the direct current circuit of the diode a bias potential to offset a potential produced by charge change of the coupling capacitor 19 which tends to bias off the detector diode.

The present invention thus provides effective means for controlling the volume of an auto radio receiver employing transistors and which utilizes a coupling capacitor of relatively high value. The presence of the described bias circuit in conjunction with the coupling capacitor provides a conducting bias on the detector diode so that sudden drops in supplying voltage will not be reflected in the volume control potentiometer in a sense to cause fading.

I claim:

1. In an automobile radio receiver operative directly from an electrical system of a vehicle which provides a potential subject to abrupt change during operation of the vehicle, including in combination, a detector circuit for demodulating radio signals comprising a signal input transformer, a detector diode, and a detector load impedance, said load impedance including first resistor means coupled between said detector diode and a reference point thereby forming a detector load across which demodulated signals are developed, an audio frequency amplifier circuit including a transistor having an input electrode and further electrodes, circuit means for deriving amplified signals from said furthehr electrodes, an audio frequency coupling capacitor connected between said first resistor means and said input electrode for applying the demodulated signals from said detector circuit to said audio frequency amplifier circuit, said coupling capacitor forming means for deriving detected audio frequency voltages from said detector circuit, voltage divider means energized by the vehicle electrical system and connected to said input electrode for biasing the same with respect to the reference point whereby a substantial direct current potential is developed across said coupling capacitor, said diode being poled to cause reverse biasing thereof upon the aforementioned potential change in the vehicle electrical system and consequent charge change of said coupling capacitor, and a second untapped resistor coupled solely from a point of said first resistor means remote from the reference point to a potential of the order of that established by the electrical system, said second resistor having a value substantially greater than that of said first resistor means whereby said first resistor means and said second resistor form a network to forward bias said diode and overcome the tendency for sensitivity change of said detector diode during the charge change of said coupling capacitor.

2. In an automobile radio receiver operative directly from an electrical system of a vehicle which provides a potential subject to abrupt change during operation of the vehicle, including in combination, a detector circuit for demodulating radio signals comprising an interconnected signal input transformer and a detector diode and a detector load impedance, said load impedance including first resistor means coupled between said detector diode and a reference point and across which demodulated signals are developed, an audio frequency amplifier circuit including a transistor having an input electrode and further electrodes, circuit means for deriving amplified signals from said further electrodes, an audio frequency coupling capacitor connected between said first resistor means and said input electrode for applying the demodulated signals from said detector circuit to said audio frequency amplifier circuit, voltage divider means energized by the vehicle electrical system and connected to said input electrode for biasing the same with respect to the reference point whereby substantial direct current potential is developed across said coupling capacitor, said diode being poled to tend to cause reverse biasing thereof upon the aforementioned potential change in the electrical system and consequent charge change of said coupling capacitor, and a second untapped resistor coupled from a point of said first resistor means remote from the reference point to a potential established by the electrical system and having a value of the order of the bias potential established at said input electrode, said second resistor having a value substantially greater than that of said first resistor means and the value thereof being chosen to forward bias said diode into substantially linear detector operation and to overcome the tendency for sensitivity change of said detector diode during the charge change of said coupling capacitor.

3. In an automobile radio receiver operative directly from an electrical system of the vehicle which provides a positive potential subject to abrupt change during operation of the vehicle, including in combination, a detector diode having first and second electrodes, signal translating means including a transformer winding coupled between said first electrode and a reference point, a detector load impedance coupled between said second electrode and the reference point and including first resistor means across which demodulated signals are developed negative with respect to the reference point, an audio frequency amplifier circuit including a PNP transistor having a base electrode and further electrodes, circuit means for deriving amplified signals from said further electrodes, an audio frequency coupling capacitor connected between a tap of said first resistor means and said base electrode for applying the demodulated signals to said transistor, a voltage divider energized by the vehicle electrical system and direct current connected to said base electrode for biasing the same positive with respect to the reference point whereby a substantial direct current potential is developed across said coupling capacitor by the potential of the vehicle electrical system, and a second resistor coupled directly across said coupling capacitor, said second resistor having a value substantially greater than that of said first resistor means and the value thereof being chosen to forward bias said diode into substantially linear detector operation whereby said bias voltage overcomes the tendency for sensitivity change of said diode upon the aforesaid abrupt potential change in the vehicle electrical system.

References Cited in the file of this patent

UNITED STATES PATENTS 2,887,574 Sciurba ---------------- May 19, 1959

2,891,146 Sciurba ---------------- June 16, 1959
2,896,077 Brandt ---------------- July 21, 1959

OTHER REFERENCES

"The Thunderbird: A New Transistorized Portable Radio" by Vanacore Sylvania, Technologist, April 1957, volume X, No. 2, pages 35 to 37.